United States Patent
Liang et al.

(10) Patent No.: US 10,298,267 B2
(45) Date of Patent: May 21, 2019

(54) REDUCING TIMING UNCERTAINTY

(71) Applicant: Nokia Solutions and Networks Oy, Espoo (FI)

(72) Inventors: Zheng Liang, Oulu (FI); Markku Antero Tirkkonen, Oulu (FI); Pasi Petteri Hyyrylainen, Haukipudas (FI)

(73) Assignee: Nokia Solutions and Networks Oy, Espoo (FI)

( * ) Notice: Subject to any disclaimer, the term of this patent is extended or adjusted under 35 U.S.C. 154(b) by 61 days.

(21) Appl. No.: 15/613,454

(22) Filed: Jun. 5, 2017

(65) Prior Publication Data
US 2017/0359088 A1    Dec. 14, 2017

(30) Foreign Application Priority Data

Jun. 8, 2016   (EP) .................................... 16173500

(51) Int. Cl.
*H03M 13/25* (2006.01)
*H04L 7/00* (2006.01)
(Continued)

(52) U.S. Cl.
CPC .......... *H03M 13/251* (2013.01); *H04L 7/005* (2013.01); *H04L 7/02* (2013.01);
(Continued)

(58) Field of Classification Search
CPC ........ H04B 1/38; H04J 3/0647; H04J 3/0638; H04L 7/02; H04L 7/08; H04L 7/005;
(Continued)

(56) References Cited

U.S. PATENT DOCUMENTS 7,366,803 B1 *  4/2008  Gaither ................. H04L 12/433
                                                 370/363
8,654,823 B1 *  2/2014  Zhu ........................ H03K 23/42
                                                 375/219
(Continued)

FOREIGN PATENT DOCUMENTS

CN           1957556 A       5/2007
CN         103825696 A       5/2014
(Continued)

OTHER PUBLICATIONS

IEEE Computer Society; IEEE Std 802.11™-2016; IEEE Standard for Information technology—Telecommunications and information exchange between systems, Local and metropolitan area networks—Specific requirements; Part 11: Wireless LAN Medium Access Control (MAC) and Physical Layer (PHY) Specifications; 2016; whole document (3534 pages); https://standards.ieee.org/about/get/802/802.11.html.

*Primary Examiner* — Rownak Islam
(74) *Attorney, Agent, or Firm* — Harrington & Smith (57) ABSTRACT

Solution for reducing timing uncertainty is provided. The solution means for receiving data in a first clock domain; means for selecting in the first clock domain a data unit to be a frame starting point and transmitting the information on the selection to a frame counter in a second clock domain; means for performing to the data in a coding/decoding unit coding or decoding, the coding/decoding unit several clock domains; means for obtaining at the output of the coding/decoding unit the position of the selected frame starting point; and means for determining timing of the correct frame starting point of the coded/decoded data utilizing the obtained position of the selected frame starting point and the information in the frame counter.

17 Claims, 5 Drawing Sheets

(51) Int. Cl.
*H04L 7/02* (2006.01)
*H04B 1/38* (2015.01)
*H04J 3/06* (2006.01)

(52) U.S. Cl.
CPC ............... *H03M 2201/422* (2013.01); *H03M 2201/4216* (2013.01); *H04B 1/38* (2013.01); *H04J 3/0647* (2013.01)

(58) Field of Classification Search
CPC ............ H03M 13/251; H03M 13/256; H03M 2201/4216; H03M 2201/422
USPC ........................................................ 370/366
See application file for complete search history.

(56) References Cited

U.S. PATENT DOCUMENTS

| | | | |
|---|---|---|---|
| 2005/0286507 A1* | 12/2005 | sterling .................... | H04L 7/02 370/363 |
| 2006/0209784 A1 | 9/2006 | Cheng Gang et al. ....... | 370/350 |
| 2015/0381338 A1* | 12/2015 | Basso ................... | H04L 7/0016 370/518 |

FOREIGN PATENT DOCUMENTS

| | | | |
|---|---|---|---|
| CN | 104080014 A | * | 10/2014 |
| EP | 1749362 A1 | | 2/2007 |
| EP | 1816771 A1 | | 8/2007 |
| WO | WO 2005/114890 A1 | | 12/2005 |

\* cited by examiner

REDUCING TIMING UNCERTAINTY

TECHNICAL FIELD

The exemplary and non-limiting embodiments of the invention relate generally to communications.

BACKGROUND

Modern communication systems comprise a multitude of different devices and apparatuses which communicate with each other. The data rates used in the communication are steadily increasing. In addition, some devices and/or apparatuses may be divided into separate parts and must be connected using high data rate connections.

Some of these connections utilize standardized or widely accepted interfaces. One of such interfaces is called Common Public Radio Interface or CPRI. CPRI is a serial interface, typically implemented with optical medium and it supports a wide range of data rates.

Apparatuses or separate parts of apparatuses or devices may typically have independent clocks. The area or section served by a single clock may be denoted as a clock domain. When data crosses clock domain borders, timing uncertainty arises. Typically the amount of uncertainty is of the order of one clock cycle of the receiving clock domain. The timing uncertainty presents problems especially when complex line and forward error correcting is used. Complex FEC requires complex processing which may comprise several clock domain crossings and coded data does not comprise any explicit timing reference points.

BRIEF DESCRIPTION

According to an aspect of the present invention, there is provided an apparatus according to claim 1.

According to an aspect of the present invention, there is provided an method according to claim 10.

One or more examples of implementations are set forth in more detail in the accompanying drawings and the description below. Other features will be apparent from the description and drawings, and from the claims.

BRIEF DESCRIPTION OF THE DRAWINGS

In the following the invention will be described in greater detail by means of preferred embodiments with reference to the accompanying drawings, in which.

DETAILED DESCRIPTION OF SOME EMBODIMENTS

Embodiments are applicable to any base station, part of a base station, a network element, corresponding component, and/or to any communication system or any combination of different communication systems that support required functionalities.

The protocols used, the specifications of communication systems, servers and user terminals, especially in wireless communication, develop rapidly. Such development may require extra changes to an embodiment. Therefore, all words and expressions should be interpreted broadly and they are intended to illustrate, not to restrict, embodiments.

Many different radio protocols to be used in communications systems exist. Some examples of different communication systems are the universal mobile telecommunications system (UMTS) radio access network (UTRAN or E-UTRAN), long term evolution (LTE, known also as E-UTRA), long term evolution advanced (LTE-A), 5th generation mobile networks, Wireless Local Area Network (WLAN) based on IEEE 802.11standard, Bluetooth®, personal communications services (PCS). IEEE refers to the Institute of Electrical and Electronics Engineers.

Figure 1:
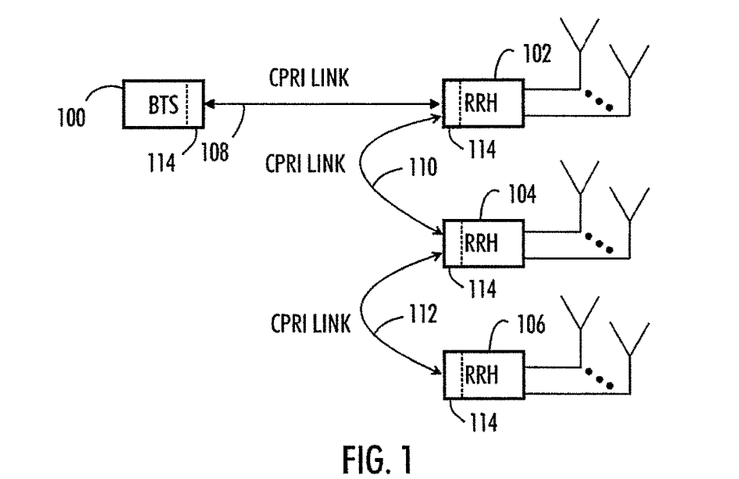
FIG. 1 illustrates an example of environment where embodiments of the invention may be applied.

FIG. 1 illustrates a non-limiting example of environment where embodiments of the invention may be applied. FIG. 1 illustrates one possible implementation of a base station. The base station comprises a baseband processing unit denoted as BTS 100 and one or more radio frequency units or remote radio heads RRH 102, 104, 106. The baseband processing unit 100 is typically connected to the radio frequency units using high speed optical connections 108, 110, 112, and protocol interface used is typically Common Public Radio Interface or CPRI. CPRI is widely used in LTE, UTRAN, and E-UTRAN, for example. The base station 100 and each radio frequency unit 102, 104, 106 comprise a CPRI Interface unit and a converter and coding/decoding unit 114. As CPRI is a serial interface, the CPRI Interface unit 114 is configured to perform conversions between a serial and a parallel data format in addition to required coding/decoding.

In the CPRI specifications there are given requirements for allowed timing uncertainties. For example, a requirement for round trip absolute accuracy is 16.276 ns. The specifications define coding which may be used over the interface. As technology has evolved, the used data rates and coding methods (line codes) have evolved as well. In the currently newest CPRI specification the line code can be 64B66B or 81310B, and the highest line rate has risen to 24.3 Gbps. This line rate requires very complicate Reed Solomon Forward error correcting coding (RS-FEC). CPRI transmission is in frame format. The complexity to detect the CPRI frame start make it very difficult to achieve such uncertainty requirement when there are multiple chained transceivers.

Usually, radio frequency module transmit timing is taken from Frame Counter which originates from base station. Radio frequency Frame counter is adjusted according to received timing information from CPRI RX frame. In TX direction, CPRI frame timing will have configurable offset to Frame Counter. Normally the timing uncertainty is caused by clock domain crossings (CDC) between different clock domains. Thus, timing uncertainty is introduced when RF receive timing from downlink, and when the timing is forwarded in the CPRI chain from apparatus to apparatus. The CPRI Interface unit 114 comprises itself several clock domains, especially as it has to support different data rates and line codes.

Figure 2:
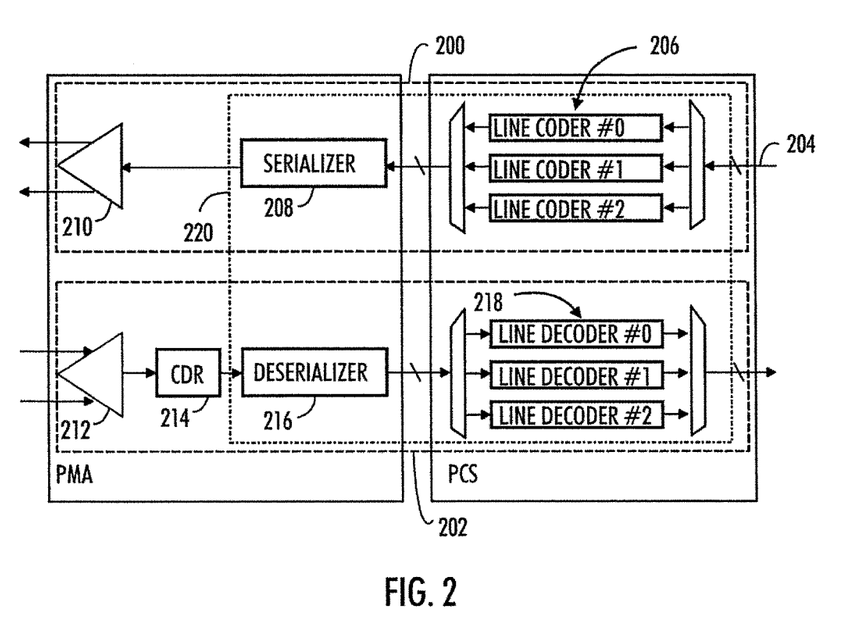
FIG. 2 is an example of an apparatus.

FIG. 2 illustrates an example of a CPRI Interface unit 114. In this example, the unit comprises a transmitting (TX) 200 and a receiving (RX) 202 section. Further, the unit comprises Physical Coding Sublayer PCS and Physical Medium Attachment sublayer PMA. On the transmitting side 200, the parallel signal 204 to be transmitted is line coded in one of the line coders 206. The unit may support several line codes. Examples of codes are, as mentioned above, 64B66B and 8B10B codes. In 8B10B line code original parallel 8 bits shall be mapped into 10 bits in serial link. In 64B66B line code original parallel 64 bits shall be mapped into 66 bits in serial link. There is further forward error coding feature (FEC) applied in addition to 64B66B line code.

The line-coded parallel data is converted into serial form in serializer or parallel-to-serial-converter 208. The serial data is transmitted by transmitter 210.

Likewise on the receiving side 202, the serial data is received by a receiver 212, clock recovery is performed in Clock and Data Recovery unit 214 and the serial data is converted into a parallel form in deserializer or serial-to-parallel converter 216. The parallel data is decoded in one of the line decoders 218.

The coders 206, decoders 218, serializer 208 and deserializer 216 may be together denoted as a converter and coding/decoding unit 220.

When the data is processed it goes through several clock domain boundaries, i.e. several Clock Domains Crossings, CDCs, occur. Each boundary introduces timing uncertainty to the signal.

In CPRI, the data is transmitted in frame format. The frame length is 10 ms. When low data rates with line code 8B10B are used, keeping the timing is not so big issue, but as data rates increase and efficient coding systems are introduced the problem becomes severe as frame boundary is unknown before FEC is decoded. For example, the RS-FEC coding in connection with the 64B66 line code presents difficulties.

Embodiments of the invention present a new timing propagating solution for a situation where desired signal faces multiple CDCs, such as in a multi-line code CPRI link. In following, general inventive concept is described first and then separately discussed for transmitting and receiving directions.

Figure 3A:
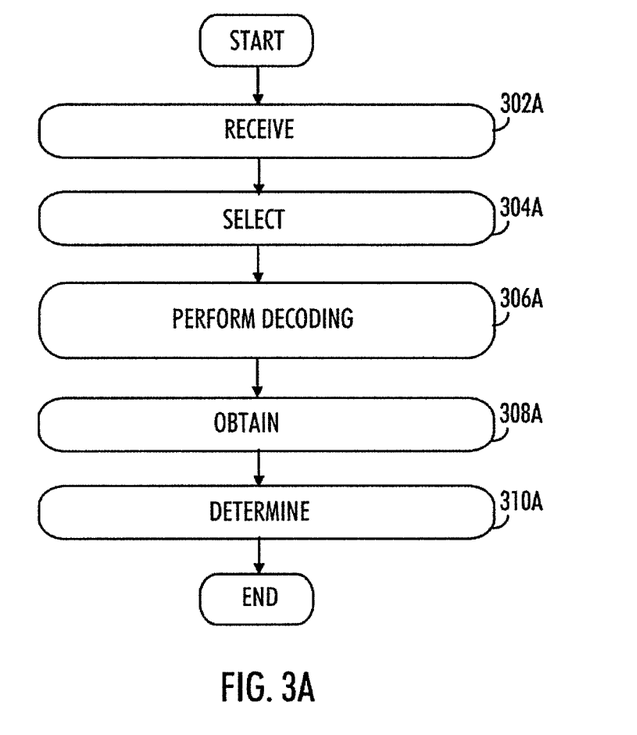
FIG. 3A illustrates selection of received frame starting point.
Figure 3B:
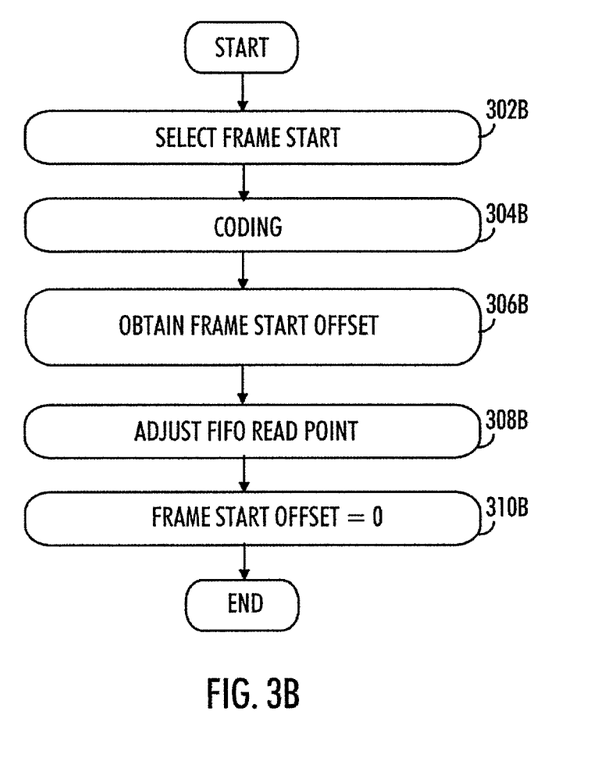
FIG. 3B illustrates adjustment of transmitted frame start.

FIGS. 3A and 3B are flowcharts illustrating embodiments of the invention. The Figure illustrates an example of the operation of an apparatus that in some embodiments may be a CPRI Interface or a part of the CPRI Interface. The steps of the flowchart may also be in different order than illustrated in FIGS. 3A and 3B.

In step 302A, the apparatus is configured to receive data in a first clock domain. In receiving direction the data may be received through optical cable or other serial medium. Thus, the data is in serial format. A serial to parallel conversion may be performed at this phase in the receiving direction. The data is received by a processing unit which has a clock or obtains a clock signal giving timing to the unit.

In step 304A, the apparatus is configured to select in the first clock domain a data unit to be a frame starting point and transmit the information on the selection to a frame counter in a second clock domain.

In the receiving direction, the frame starting point is a virtual starting point as the real starting point of the frame is at this phase not yet known.

In an embodiment, a data bit is inserted into the data to mark the selected frame starting point.

In step 306A, the apparatus is configured to perform to the data in a decoding unit coding or decoding. The decoding unit comprises several clock domains.

In step 308A, the apparatus is configured to obtain at the output of the decoding unit the position of the selected frame starting point.

In the transmitting direction parallel format data is coded. The process involves several clock domains and the data experiences several Clock Domains Crossings which increase timing inaccuracy.

In step 310A, the apparatus is configured to determine timing of the correct frame starting point of the coded or decoded data utilising the obtained position of the selected frame starting point and the information in the frame counter.

FIG. 3B describes an example in the transmitting direction.

In step 302B, the apparatus is configured to configure transmit frame start timing. i.e., a given a frame starting point is selected. In an embodiment, a data bit is inserted into the data to mark the selected frame starting point.

In step 304B, the apparatus is configured to put the data stream to be transmitted including frame start through coding unit. Here several clock domain crossings occur.

In step 306B, the apparatus is configured to obtain timing offset directly from system clock domain.

In step 308B, the apparatus is configured to adjust FIFO read pointer according to timing offset.

In step 310B, the transmitted frame start is same as configured in PMA clock domain.

In following, example embodiments of receiving and transmitting directions are studied separately.

Figure 4:
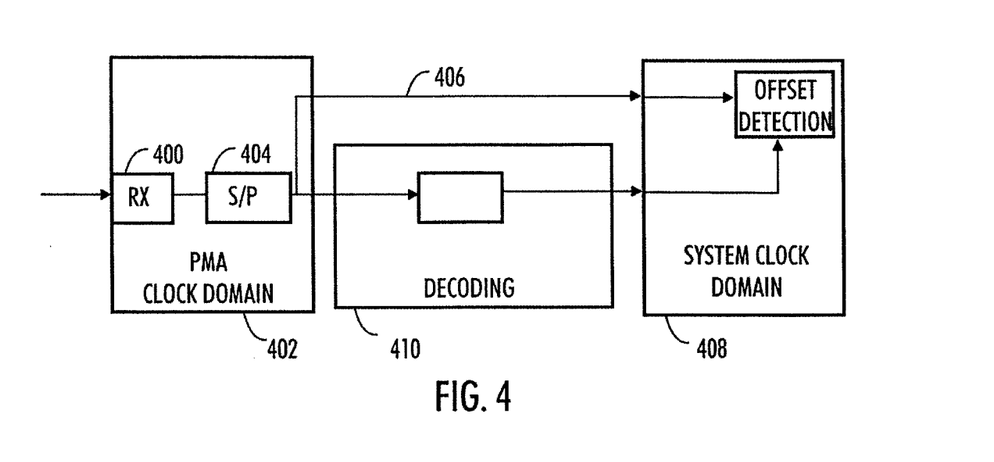
FIG. 4 illustrates an embodiment of the invention in the receiving part of the CPRI Interface.

FIG. 4 illustrates an embodiment of the invention in the receiving part of the CPRI Interface. The serial format signal is received by a receiver 400 in PMA clock domain 402 from the serial medium such as an optical cable. The receiver may be a prior art receiver.

The serial format data is converted into parallel form in serial-to-parallel converter 404.

Figure 5A:
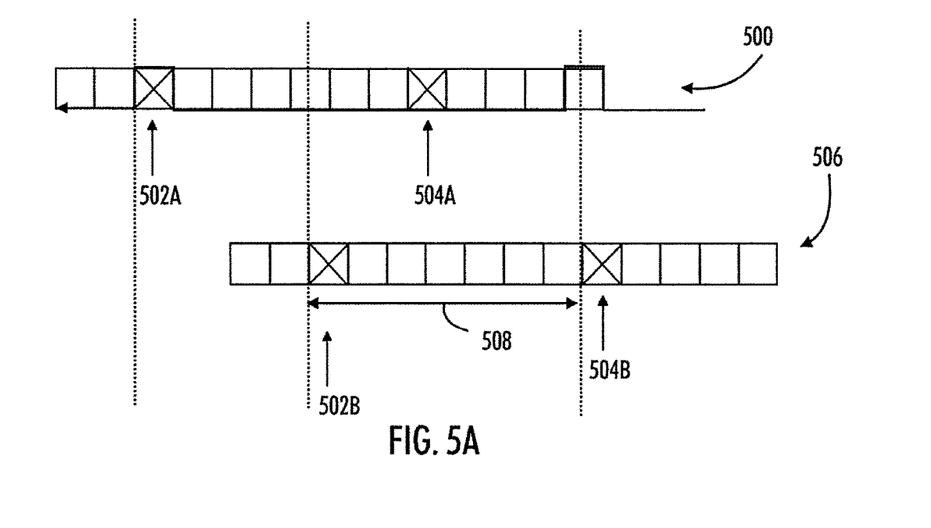
FIG. 5A illustrates a simplified illustration of a received frame.

In PMA clock domain, a data unit assumed to be a frame starting point is selected. As mentioned, in CPRI signal is in frame format and the frame is 10 ms long. FIG. 5A is a simplified illustration of the frame 500. At this phase, the actual starting point 502A of the frame is not known. A virtual starting point 504A of the frame may be freely selected from the data units of the frame. In an embodiment, a bit is inserted in the data in the selected position to mark the virtual starting point of frame.

Information 406 on the selection of the virtual frame start is transmitted to frame counter in system clock domain 408 of the CPRI Interface. At the system clock domain a clock cycle uncertainty is introduced to the virtual starting point of the frame as there is a clock domain crossing.

The received signal is fed to the decoding unit 410 of the receiver where line code decoding and possible FEC decoding is performed. The operation involves several crossings of clock domain boundaries, thus timing uncertainties are introduced. FIG. 5A shows also a simplified illustration of the frame 506 at the output of the decoding unit. The real frame starting point 502B is determined during the decoding.

The virtual starting point 504B goes naturally through the same decoding process and same clock domain crossings. However, the frame counter is aware of the virtual frame start with one clock cycle uncertainty due to the information 406. By comparing the location 502B with location to the location 504B timing offset 508 may be determined and the timing of the real frame start determined. At the same time, any other latency occurring in the converter and decoding unit may be detected.

In an embodiment, with the knowledge of the timing offset 508 the timing of the parallel format data may be corrected.

Figure 5B:
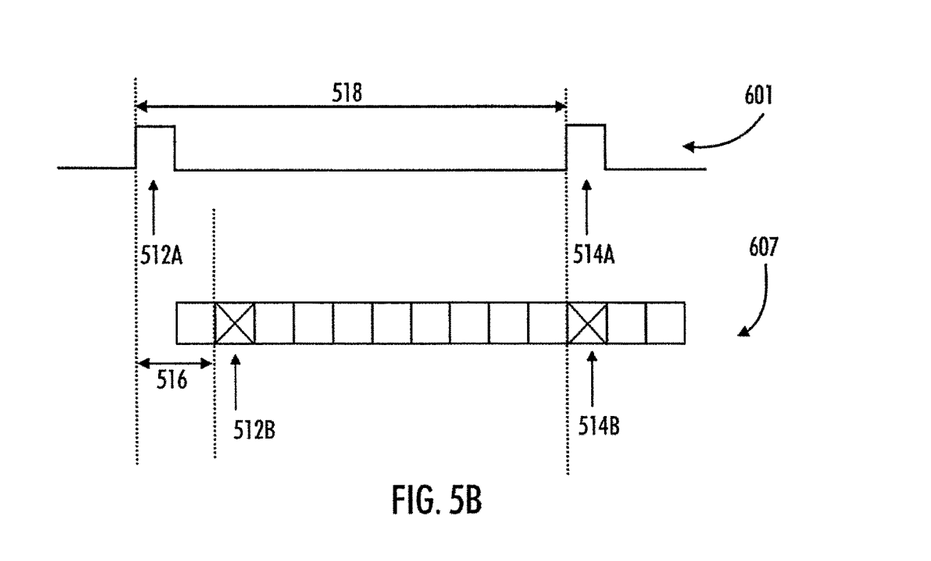
FIG. 5B illustrates a simplified illustration of a transmitted frame

FIG. 5B illustrates transmitting direction. In the transmitting direction, frame start transmit timing in PMA clock domain is configured as 512A. Because of the uncertainty caused by multi clock domain in coding unit, the coded frame start timing in PMA clock domain is 512B. The offset 516 between 512A and 512B is measured with PMA clock cycles. The apparatus may adjust the frame start timing according to measured offset 516, and then final transmitted frame start timing 514B will be same as configured 514A. The adjusted time 518 is multiple integer times of frame length.

Figure 6:
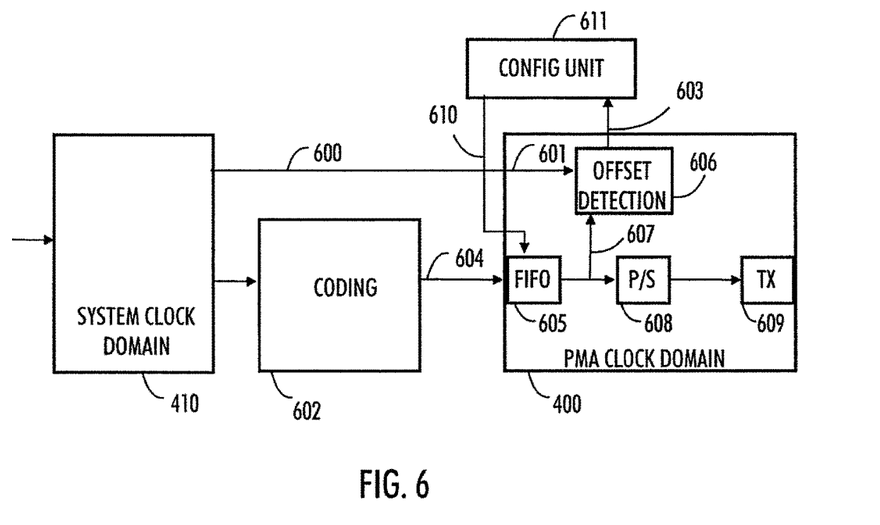
FIG. 6 illustrates an embodiment of the invention in the transmitting part of the CPRI Interface.

FIG. 6 illustrates an embodiment of the invention in the transmitting part of the CPRI Interface. The real frame starting point may be determined and transmitted 600 to frame counter in the PMA clock domain. At the PMA clock domain one clock cycle uncertainty is introduced to the starting point of the frame as there is a clock domain boundary.

A line coding and possible FEC coding is performed to the data in the coding unit 602 of the transmitter side. The operation involves several crossings of clock domain boundaries, thus timing uncertainties are introduced. At the output of the coding unit the signal 604 is taken to First-in-first out buffer FIFO 605 in PMA clock domain.

In FIFO there is one extra flag bit as indication that the data unit in same address is frame start data unit. The initial FIFO read pointer can be the middle address of FIFO 605. the FIFO output without flag bit will be sent into parallel-to-serial converter 608 and the FIFO output flag bit 607 will be sent into offset detection unit 606.

The timing offset 516 between configured timing 512A and current timing 512B shall be reported 603 to configuring unit 611. The configuring unit 611 can adjust FIFO 605 read pointer to make configured timing 514A and transmitted timing 514B have the same clock cycle. Thus position of the real frame starting point is adjusted successfully.

At this phase the configured position of the starting point 600 is in PMA clock domain known with one clock cycle uncertainty. The timing uncertainty caused by the different clock domains of the converter and coding unit 602, so called timing offset, may thus be determined 606 in PMA clock domain with one clock cycle uncertainty. At the same time, any other latency occurring in the converter and coding unit may be detected.

The data to be transmitted is converted into serial form in parallel-to-serial converter 608 and transmitted by transceiver 609.

In an embodiment, the timing of the serial format data may be adjusted on the basis of the determined timing offset.

With the proposed solution the timing uncertainty is one clock cycle of the system clock domain in the receiving side and one clock cycle of the PMA clock domain in the transmitting side regardless of the amount of clock domain crossings in the converter and coding/decoding phase. Thus, even when the CPRI supports a variety of different line codes and applies RS-FEC, the timing offset remains fixed.

Figure 7A:
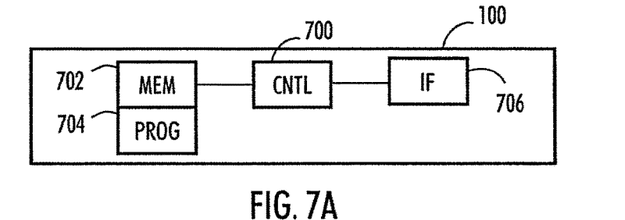
FIGS. 7A and 7B illustrate simplified examples of apparatuses applying some embodiments of the invention.

FIG. 7A illustrates an embodiment. The figure illustrates a simplified example of an apparatus applying embodiments of the invention. In some embodiments, the apparatus may be a base station 100 or a part of a base station.

It should be understood that the apparatus is depicted herein as an example illustrating some embodiments. It is apparent to a person skilled in the art that the apparatus may also comprise other functions and/or structures and not all described functions and structures are required. Although the apparatus has been depicted as one entity, different modules and memory may be implemented in one or more physical or logical entities.

The apparatus of the example includes a control circuitry 700 configured to control at least part of the operation of the apparatus.

The apparatus may comprise a memory 702 for storing data. Furthermore the memory may store software 704 executable by the control circuitry 700. The memory may be integrated in the control circuitry.

The apparatus further comprises an interface circuitry 706 configured to connect the apparatus to other devices and network elements of communication system, for example to other corresponding apparatuses and to remote radio heads. The interface may provide a wired or wireless connection. The interface may be a CPRI interface realised with an optical cable, for example.

The software 704 may comprise a computer program comprising program code means adapted to cause the control circuitry 700 of the apparatus to receive data in a first clock domain; select in the first clock domain a data unit to be a frame starting point and transmitting the information on the selection to a frame counter in a second clock domain; perform to the data in a coding/decoding unit coding or decoding, the coding/decoding unit comprising several clock domains; obtain at the output of the coding/decoding unit the position of the selected frame starting point and determine timing of the correct frame starting point of the coded/decoded data utilising the obtained position of the selected frame starting point and the information in the frame counter.

Figure 7B:
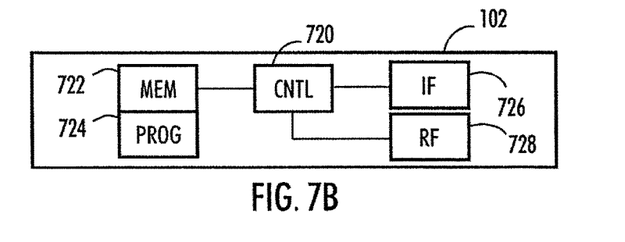

FIG. 7B illustrates an embodiment. The figure illustrates a simplified example of an apparatus applying embodiments of the invention. In some embodiments, the apparatus may be a remote radio head 102 of a base station 100 or a part of a remote radio head.

It should be understood that the apparatus is depicted herein as an example illustrating some embodiments. It is apparent to a person skilled in the art that the apparatus may also comprise other functions and/or structures and not all described functions and structures are required. Although the apparatus has been depicted as one entity, different modules and memory may be implemented in one or more physical or logical entities.

The apparatus of the example includes a control circuitry 720 configured to control at least part of the operation of the apparatus.

The apparatus may comprise a memory 722 for storing data. Furthermore the memory may store software 724 executable by the control circuitry 720. The memory may be integrated in the control circuitry.

The apparatus further comprises an interface circuitry 726 configured to connect the apparatus to other devices and network elements of communication system, for example to a base station and/or to other remote radio heads. The interface may provide a wired or wireless connection. The interface may be a CPRI interface realised with an optical cable, for example.

The apparatus may further comprise a transceiver 728. The transceiver is operationally connected to the control circuitry 720. It may be connected to an antenna arrangement (not shown). The transceiver may provide an air interface of a base station.

The software 724 may comprise a computer program comprising program code means adapted to cause the control circuitry 720 of the apparatus to control the apparatus to receive data in a first clock domain; select in the first clock domain a data unit to be a frame starting point and transmitting the information on the selection to a frame counter in a second clock domain; perform to the data in a coding/decoding unit coding or decoding, the coding/decoding unit comprising several clock domains; obtain at the output of the coding/decoding unit the position of the selected frame starting point and determine timing of the correct frame starting point of the coded/decoded data utilising the obtained position of the selected frame starting point and the information in the frame counter.

The embodiments may be applied in many different communication systems, such as LTE or LTE-A. Another example of a suitable communications system is the 5G concept. 5G is likely to use multiple input-multiple output (MIMO) antennas, many more base stations or nodes than the LTE (a so-called small cell concept), including macro sites operating in co-operation with smaller stations and perhaps also employing a variety of radio technologies for better coverage and enhanced data rates. 5G will likely be comprised of more than one radio access technology (RAT), each optimized for certain use cases and/or spectrum. 5G mobile communications will have a wider range of use cases and related applications including video streaming, augmented reality, different ways of data sharing and various forms of machine type applications, including vehicular safety, different sensors and real-time control. 5G is expected to have multiple radio interfaces, namely below 6 GHz, cmWave and mmWave, and also being integradable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, below 6 GHz-cmWave-mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The steps and related functions described in the above and attached figures are in no absolute chronological order, and some of the steps may be performed simultaneously or in an order differing from the given one. Other functions can also be executed between the steps or within the steps. Some of the steps can also be left out or replaced with a corresponding step.

The apparatuses or controllers able to perform the above-described steps may be implemented as an electronic digital computer, which may comprise a working memory (RAM), a central processing unit (CPU), and a system clock. The CPU may comprise a set of registers, an arithmetic logic unit, and a controller. The controller is controlled by a sequence of program instructions transferred to the CPU from the RAM. The controller may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present.

This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

An embodiment provides a computer program embodied on a distribution medium, comprising program instructions which, when loaded into an electronic apparatus, are configured to control the apparatus to execute the embodiments described above.

The computer program may be in source code form, object code form, or in some intermediate form, and it may be stored in some sort of carrier, which may be any entity or device capable of carrying the program. Such carriers include a record medium, computer memory, read-only memory, and a software distribution package, for example. Depending on the processing power needed, the computer program may be executed in a single electronic digital computer or it may be distributed amongst a number of computers.

The apparatus may also be implemented as one or more integrated circuits, such as application-specific integrated circuits ASIC. Other hardware embodiments are also feasible, such as a circuit built of separate logic components. A hybrid of these different implementations is also feasible. When selecting the method of implementation, a person skilled in the art will consider the requirements set for the size and power consumption of the apparatus, the necessary processing capacity, production costs, and production volumes, for example.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus, comprising:
   at least one processor; and
   at least one memory including computer program code,
   the at least one memory and the computer program code configured, with the at least one processor, to cause the apparatus to perform operations comprising:
   receiving data in a first clock domain;
   selecting in the first clock domain a data unit of the data to be a virtual frame starting point and transmitting information on the virtual frame starting point to a frame counter in a second clock domain;

performing to the data using the virtual frame starting point, coding or decoding, the coding or decoding performed over several clock domains;
obtaining a position of the virtual frame starting point; and
determining for the first clock domain a timing offset between the virtual frame starting point and a real frame starting point of the data based on at least the obtained position of the virtual frame starting point and the information to the frame counter in the second clock domain.

2. The apparatus of claim 1, wherein the at least one memory and the computer program code are configured, with the at least one processor, to cause the apparatus to perform operations comprising:
inserting in the first clock domain into the data a bit to mark the virtual frame starting point of the data.

3. The apparatus of claim 1, wherein the at least one memory and the computer program code are configured, with the at least one processor, to cause the apparatus to perform operations comprising:
receiving the data in the first clock domain in serial format; and
determining a position of the real frame starting point during the coding or decoding.

4. The apparatus of claim 2, wherein the at least one memory and the computer program code are configured, with the at least one processor, to cause the apparatus to perform operations comprising:
determining the position of the virtual frame starting point in the data based on the inserted bit.

5. The apparatus of claim 1, wherein the first clock domain is a Physical Medium Attachment clock domain and the second clock domain is a system clock domain.

6. The apparatus of claim 1, wherein the apparatus is a part of a Common Public Radio Interface receiver.

7. The apparatus of claim 1, wherein the at least one memory and the computer program code are configured, with the at least one processor, to cause the apparatus to perform operations comprising:
based at least on the information of the virtual frame starting point to the frame counter in the second clock domain, adjusting timing of the real frame starting point.

8. The apparatus of claim 2, wherein
the position of the virtual frame starting point in the data is determined based on the inserted bit.

9. The apparatus of claim 7, wherein the first clock domain is a system clock domain and the second clock domain is a Physical Medium Attachment clock domain.

10. The apparatus of claim 7, wherein the apparatus is a part of a Common Public Radio Interface transmitter.

11. A method, comprising: reducing timing uncertainty comprising;
receiving data in a first clock domain;
selecting in the first clock domain a data unit of the data to be a virtual frame starting point and transmitting information on the virtual frame starting point to a frame counter in a second clock domain;
performing to the data using the virtual frame starting point coding or decoding, the coding or decoding performed over several clock domains;
obtaining a position of the virtual frame starting point;
determining for the first clock domain a timing offset between the virtual frame starting point and a real frame starting point of the data based on the obtained position of the virtual frame starting point and the information in the frame counter in the second clock domain.

12. The method of claim 11, further comprising:
inserting in the first clock domain into the data a bit to mark the virtual frame starting point.

13. The method apparatus of claim 11, further comprising:
receiving the data in the first clock domain in serial format; and
determining a position of the real frame starting point during the coding or decoding.

14. The method of claim 12, further comprising
determining the position of the virtual frame starting point in the data based on the inserted bit.

15. The method of claim 11, further comprising: based at least on the information of the virtual frame starting point to the frame counter in the second clock domain, adjusting the timing of the real frame starting point.

16. The method of claim 15,
wherein the position of the virtual frame starting point in the data is determined based on the inserted bit.

17. A computer program product comprising a non-transitory computer-readable medium having computer program code thereon, wherein the computer program code is configured, when loaded into and executed by an apparatus, to cause the apparatus to perform operations comprising:
receiving data in a first clock domain;
selecting in the first clock domain a data unit of the data to be a frame starting point and transmitting information on the virtual frame starting point to a frame counter in a second clock domain;
performing using the virtual frame starting point, coding or decoding of the data, the coding or decoding being performed over several clock domains;
obtaining a position of the selected virtual frame starting point;
determining for the first clock domain a timing offset between the virtual frame starting point and a real frame starting point of the data based on at least the obtained position of the selected virtual frame starting point and the information to the frame counter in the second clock domain.

* * * * *

UNITED STATES PATENT AND TRADEMARK OFFICE
CERTIFICATE OF CORRECTION

PATENT NO. : 10,298,267 B2  
APPLICATION NO. : 15/613454  
DATED : May 21, 2019  
INVENTOR(S) : Zheng Liang, Markku Antero Tirkkonen and Pasi Petteri Hyyrylainen Page 1 of 1

It is certified that error appears in the above-identified patent and that said Letters Patent is hereby corrected as shown below:

In the Claims

In Claim 17:
Column 10, Line 46, "selected" should be deleted.

In Claim 17:
Column 10, Line 51, "selected" should be deleted.

Signed and Sealed this
Sixteenth Day of July, 2019

Andrei Iancu
*Director of the United States Patent and Trademark Office*